United States Patent [19]
Antoniadis et al.

[11] Patent Number: 6,004,685
[45] Date of Patent: Dec. 21, 1999

[54] LED DOPED WITH PERIFLANTHENE FOR EFFICIENT RED EMISSION

[75] Inventors: Homer Antoniadis, Mountain View, Calif.; Allen J. Bard, Austin, Tex.

[73] Assignee: Hewlett-Packard Company & The Board of Regents of The University of Texas System, Palo Alto, Calif.

[21] Appl. No.: 08/997,143

[22] Filed: Dec. 23, 1997

[51] Int. Cl.[6] .................................................. H05B 33/14
[52] U.S. Cl. .......................... 428/690; 428/691; 428/917; 313/504
[58] Field of Search .................... 428/690, 691, 428/917; 313/504

[56] References Cited

PUBLICATIONS

Debad et al. "Dibenzotetraphenylperiflanthene: Synthesis, Photophysical Properties, and Electrogenerated Chemiluminescence", J. Am. Chem. Soc. 118(10), 23744–9, Jan. 1996.

Primary Examiner—Charles Nold

[57] ABSTRACT

An OLED having a cathode constructed from a first conducting layer. An electron transport layer constructed from a first electron transport material overlays the cathode. An electroluminescent layer constructed from the first electron transport material doped with dibenzotetraphenylperiflanthene overlays the electron transport layer. A hole transport layer constructed from a first hole transport material overlays the electroluminescent layer. The anode overlays the hole transport layer. In one embodiment of the invention, a second hole transport layer constructed from a second hole transport material is sandwiched between the anode and the first hole transport layer. In a third embodiment of the invention, a second electron transport layer constructed from a second electron transport material is sandwiched between the electroluminescent layer and the first hole transport layer.

6 Claims, 4 Drawing Sheets

LED DOPED WITH PERIFLANTHENE FOR EFFICIENT RED EMISSION

FIELD OF THE INVENTION

The present invention relates to electroluminescent devices, and more particularly, to light-emitting devices based on small organic molecules.

BACKGROUND OF THE INVENTION

Organic light-emitting diodes (OLEDs) have the potential for providing inexpensive alternatives to LEDs. OLEDs may be fabricated by coating the appropriate surfaces with the organic material either from solution or by using conventional vacuum deposition techniques, and hence, do not require the use of high cost fabrication systems such as those utilized in the fabrication of semiconductor devices. A simple OLED may be constructed from an electroluminescent layer sandwiched between an electron injection electrode and a hole injection electrode. More complicated devices utilize electron and hole transport layers between the above mentioned electrodes and the electroluminescent layer.

Addressable color displays may be constructed from OLEDs if individual OLEDs having three primary colors can be constructed. The individual OLEDs must have the same operating voltages. Hence, OLEDs that are constructed from a common light emitting layer which is doped with compounds to set the color are preferred, provided the dopants do not alter the operating voltage.

Unfortunately, compounds having high efficiency and satisfactory lifetimes for constructing OLEDs that emit in the red portion of the spectrum are lacking.

Broadly, it is the object of the present invention to provide an improved OLED.

It is a further object of the present invention to provide a set of OLEDs that can be utilized in constructing a color display, and more particularly in the red portion of the spectrum.

It is a still further object of the present invention to provide an OLED that has higher quantum efficiency than prior art OLEDs.

It is yet another object of the present invention to provide an OLED dopant material that does not alter the operating voltage of the OLED while providing emission in the red portion of the spectrum.

These and other objects of the present invention will become apparent to those skilled in the art from the following detailed description of the invention and the accompanying drawings.

SUMMARY OF THE INVENTION

The present invention is an OLED having a cathode constructed from a first conducting layer. An electron transport layer constructed from a first electron transport material overlays the cathode. An electroluminescent layer constructed from the first electron transport material doped with dibenzotetraphenylperiflanthene overlays the electron transport layer. A hole transport layer constructed from a first hole transport material overlays the electroluminescent layer. The anode overlays the hole transport layer. In one embodiment of the invention, a second hole transport layer constructed from a second hole transport material is sandwiched between the anode and the first hole transport layer. In a third embodiment of the invention, a second electron transport layer constructed from a second electron transport material is sandwiched between the electroluminescent layer and the first hole transport layer.

DETAILED DESCRIPTION OF THE INVENTION

Figure 1:
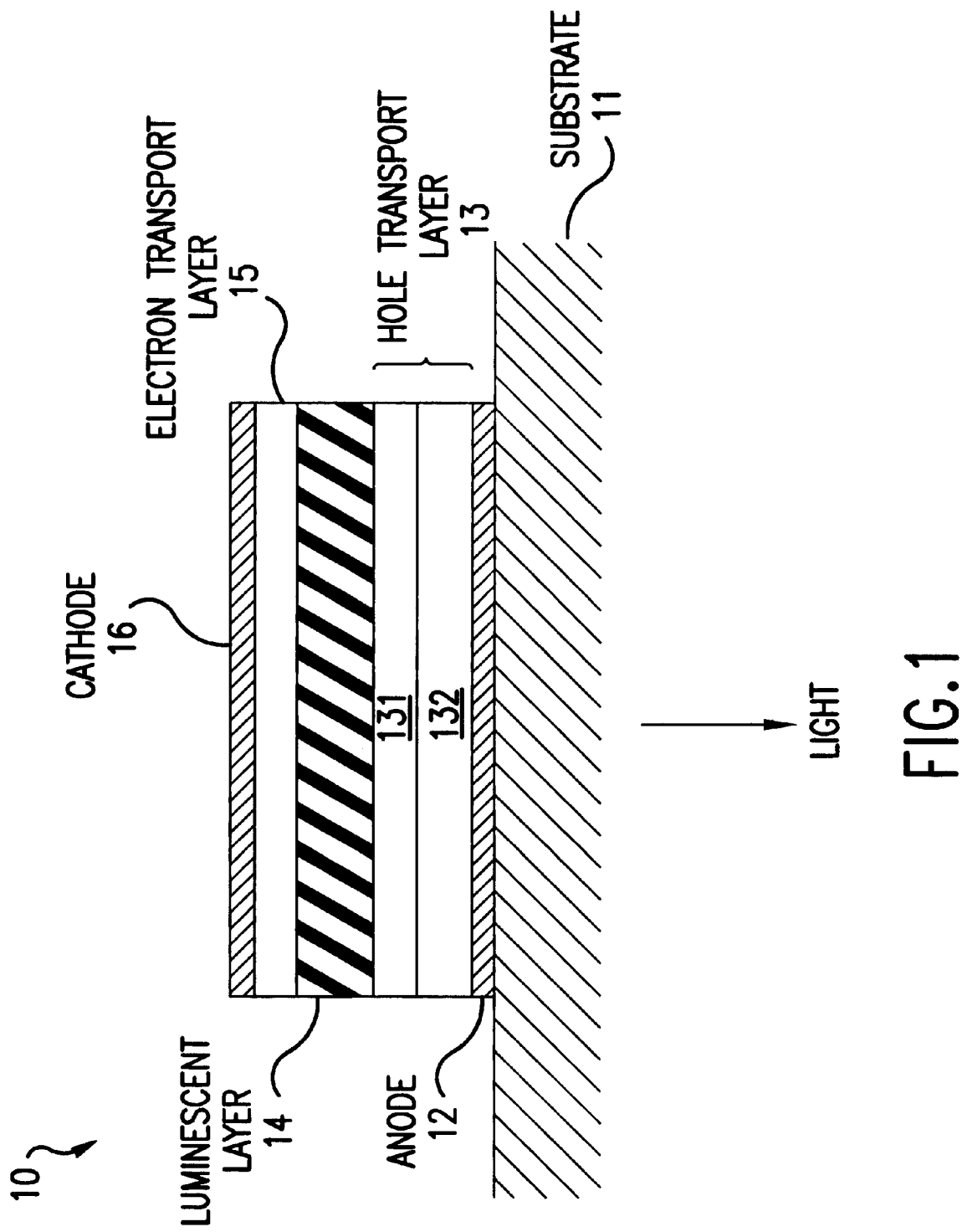
FIG. 1 is a cross-sectional view of an OLED according to the present invention.

The present invention may be more easily understood with reference to FIG. 1 which is a cross-sectional view of a OLED 10 according to the present invention. OLED 10 is typically constructed on a transparent substrate 11. A transparent anode 12 is deposited on substrate 11. Anode 12 provides a source of holes that combine with electrons injected via cathode 16 in luminescent layer 14 to generate light. To facilitate the injection of the electrons into luminescent layer 14, an electron transport layer 15 is utilized. Similarly, to facilitate the injection of holes into luminescent layer 14, a hole transport layer 13 is included between anode 12 and luminescent layer 14. The various layers may be deposited by any of a number of conventional techniques such as spin casting, vapor deposition, etc.

In the preferred embodiment of the present invention, anode 12 is preferably constructed from transparent conducting film with a work function between 4.5 and 5.5 eV. Examples are indium tin oxide and gold. The cathode is constructed from a conducting metal with a work function between 2.5 and 4.5 eV. Examples are lithium, calcium, magnesium, indium, silver, aluminum or alloys of the above. In the preferred embodiment of the present invention, cathode 16 is constructed from an alloy of Mg/Al, Mg/Ag or Li/Al. Additional examples of acceptable anode materials may be found in U.S. Pat. No. 5,409,783 which is hereby incorporated by reference.

Figure 2:
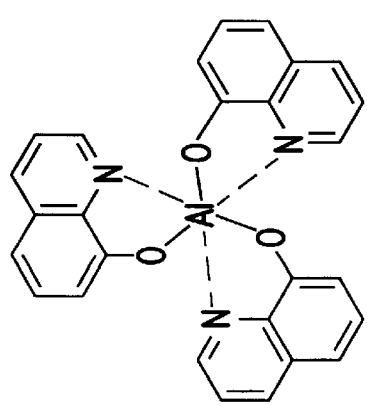
FIG. 2 is the chemical formula of a compound that may be used for the electron transport layer of the present invention.

An electron transport layer such as layer 15 is preferably used to improve the efficiency of electron injection into luminescent layer 14. Electron transport layer 15 can be constructed from any compound having an energy band intermediate between that of cathode 16 and luminescent layer 14. In the preferred embodiment of the present invention, electron transport layer 15 comprises a layer of a metal chelated oxinoid compound and most preferably of tris(8-quinoline)aluminum (Alq$_3$) whose formula is shown in FIG. 2. The thickness of electron transport layer 15 is typically between 50 and 1000 Å. Additional examples of acceptable compounds may also be found in U.S. Pat. No. 5,409,783.

Figure 3:
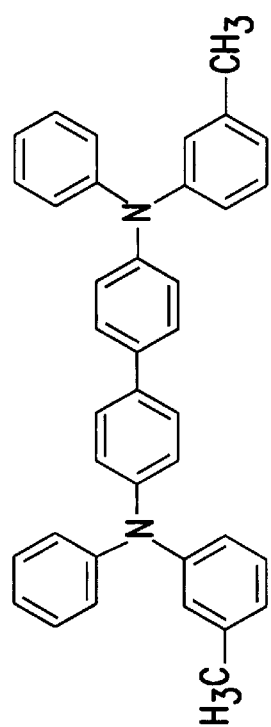
FIGS. 3 and 4 are the chemical formulae of compounds that may be used for the hole transport layer of the present invention.
Figure 4:
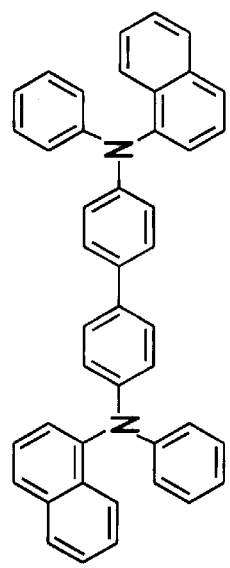

Similarly, the hole transport layer matches luminescent layer 14 to anode 12. When anode 12 is constructed from indium tin oxide, the hole transport layer is preferably constructed from two layers, 131 and 132. Layer 131 improves the efficiency of hole injection into luminescent layer 14 by providing a material that has an energy band between those of anode 12 and luminescent layer 14. In the preferred embodiment of the present invention, layer 131 comprises an aromatic tertiary amine and most preferably of (N,N'-diphenyl-N,N'-bis-(3-methylphenyl)-{1,1'-biphenyl}-4,4'-diamine) (TPD) or 4,4'-Bis[N-(1-naphthyl)-N-phenylamino]-biphenyl (NPD) whose formula is shown in FIGS. 3 and 4 respectively. Further examples of aromatic tertiary amines that may utilized may also be found in U.S. Pat. No. 5,409,783.

Figure 6:
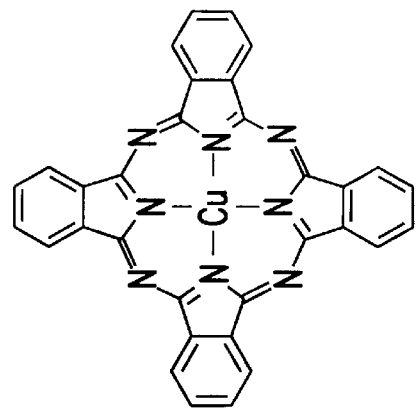
FIGS. 5 and 6 are the chemical formulae of compounds that may be used between the hole transport layer and an anode constructed from indium tin oxide.
Figure 5:
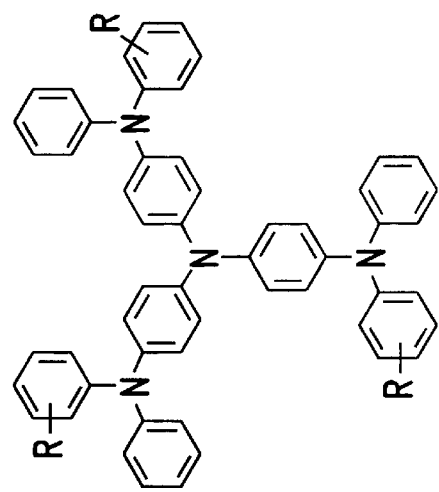

The second layer provides a physical interface between layer 131 and anode 12. It is found experimentally that compounds such as TPD do not bond well to indium tin oxide. Hence, an interface layer 132 which bonds well to indium tin oxide and has an ionization potential between that of indium tin oxide and layer 131 is utilized. In the preferred embodiment of the present invention, layer 132 is constructed from star-burst amines and most preferably from 4,4'4"-tris[N-(3-methoxyphenyl-N-phenylamino] triphenylamine (3MeODATA) or other compounds of the chemical formula shown in FIG. 5. Here, R is hydrogen, methyl, methoxy, or a fused aryl. Alternatively layer 132 is constructed from porphyrinic compounds and more preferably from copper phthalocyanine whose chemical formula is shown in FIG. 6. Additional examples of such compounds may also be found in U.S. Pat. No. 5,409,783. In general, layer 131 may be viewed as being part of the anode.

Figure 7:
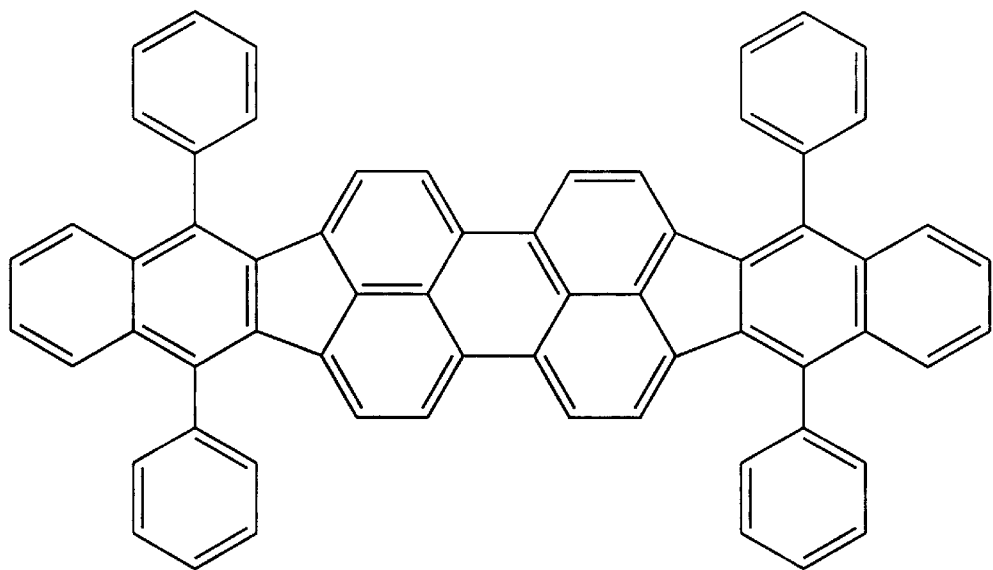
FIGS. 7 and 8 show the chemical formula of the preferred compound for use in constructing the electroluminescent layer.

The luminescent layer 14 preferably includes the material used in the electron transport layer 15 doped with a dopant comprising dibenzotetraphenylperiflanthene (DBTPPF), whose chemical formula is shown in FIG. 7. Embodiments utilizing this dopant have been found to have efficiencies as high as 4% (photons/electron). Most of the emissive energy is concentrated in a narrow band having a full width at half maximum of about 40 nm, centered at 610 nm. However, the emission spectrum extends to wavelengths of greater than 700 nm with this compound.

Figure 8:
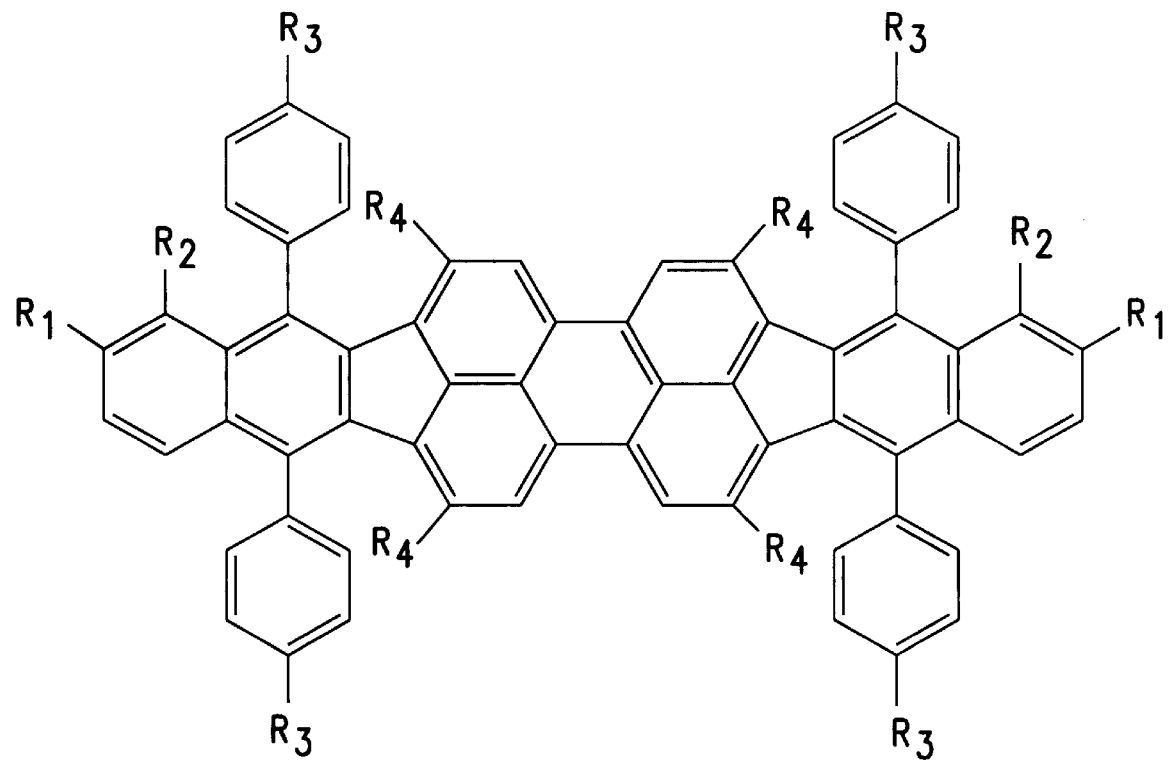

The present invention may also utilize modifications of the compound shown in FIG. 7 as the dopant. A more general dopant compound is shown in FIG. 8. The R1–R4 can be independently selected from hydrogen, the alkyls, alkoxyls and their substitutions (methyl, ethyl, tert-butyl, methoxy, etc.), the aryls and substituted aryls (phenyl, napthyl, phenoxy, etc), and the halogens. The reader is referred to the Journal of the American Chemical Society, 118, p. 2374 (1996) for details of the method for synthesizing the compounds shown in FIG. 7. This article is hereby incorporated by reference.

Figure 9:
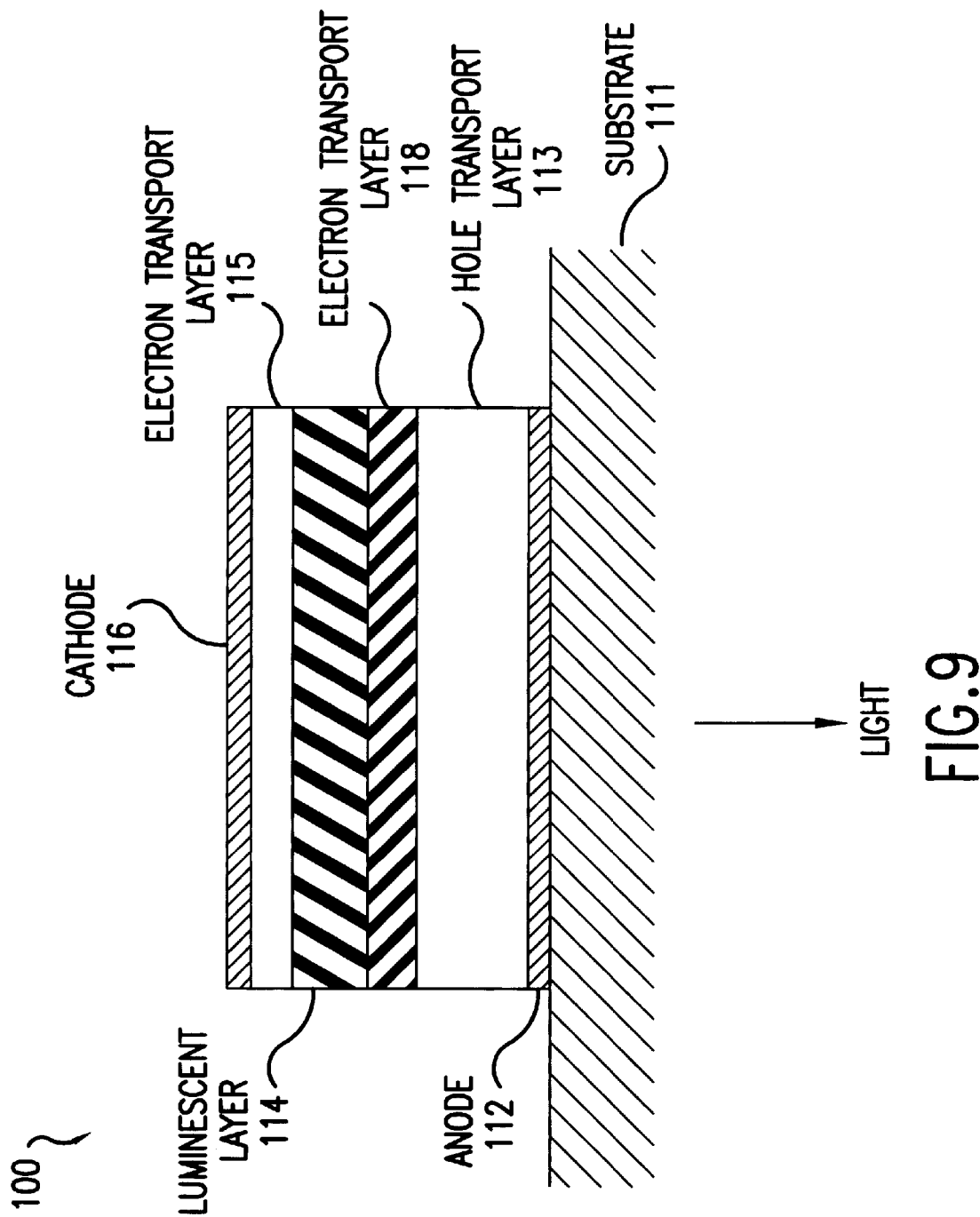
FIG. 9 is a cross-sectional view of another embodiment of a OLED according to the present invention.

It should be noted that luminescent layer 14 can also be constructed from two layers to improve the injection efficiency. Such an embodiment is shown at 100 in FIG. 9. To simplify the discussion, an element that serves the same function as a corresponding element shown in FIG. 1 is referenced by a reference number that is 100 greater than the corresponding reference number shown in FIG. 1. The first luminescent layer 114 is the same as that as described above with reference to FIG. 1. The second layer 118 comprises a second electron transport material for interfacing the luminescent layer 114 to hole transport layer 113. Suitable materials for this second electron transport material may be found in U.S. Pat. No, 5,405,709 which is hereby incorporated by reference. The reader is specifically directed to columns 9, 11, and 13–14 of this patent. The second layer 118 may also be a luminescent layer. Such embodiments are useful when an emission spectrum having a number of components is desired, as one of these components can be provided by layer 118.

The dopant of the present invention may also be used to create an OLED which emits white light. The non-doped electron transport material $Alq_3$ emits light in the green region over a broad range of wavelengths between 500 and 600 nm. The dopant emits light over a range of wavelengths between 600 and 700 nm. If the dopant concentration is less than that needed to shift all of the emissions to the dopant wavelength, both emission spectra will be present. This provides an essentially white light source. At dopant concentrations of 0.5 to 2%, white light with a slight yellow-green coloration is observed. At concentrations above 4%, the emission in almost totally in the red portion of the spectrum.

It has also been found experimentally that the operating voltage of the device is independent of the dopant concentration from 0 to 8%.

EXAMPLE 1 (Prior Art)

A transparent anode of indium tin oxide (ITO)-coated glass (Corning™, with a sheet resistance of 15 Ω/square) was washed with a water-based detergent, followed by acetone and isopropyl alcohol rinses. A hole injecting layer of copper phthalocyanine (FIG. 6) with a thickness of 150 Å was deposited on the anode by vacuum deposition at the rate of 1–2 Å/sec. Next, a hole transporting layer of NPD (FIG. 4) with a thickness of 600 Å was deposited on the hole injecting layer by vacuum deposition at the rate of about 2 Å/sec. An electron injecting and transporting layer of $Alq_3$ with thickness 600 Å was deposited on top of the hole transporting layer at the rate of 2 Å/sec. Finally, a cathode composed of 1000 Å of Mg and a protecting layer of 1000 Å Ag was deposited on the electron injecting and transporting layer. All three organic materials and the two metals were evaporated from five separate RADAK II™ vacuum evaporation sources.

The resulting organic EL device was operated in an $N_2$-rich dry box under a constant current of 40 mA/cm². Its initial output luminance was 1250 cd/m² and the voltage between the anode and the cathode was 7.8 V. The temperature of the dry box was 33° C. during the constant current test. The half-life of the device was between 300 and 500 hours. The emitted light had a yellow-green appearance with an emission spectrum that had a maximum at 535 nm, as is typical with $Alq_3$ emission.

EXAMPLE 2 (Prior Art)

Example 1 was repeated with a hole injecting layer of m-MTDATA (FIG. 5, R=CH₃) instead of copper phthalocyanine. The thickness of the layer of m-MTDATA was 1000 Å and the thickness of the NPD was 300 Å.

The resulting organic EL device was operated in an $N_2$-rich dry box, under the same conditions as Example 1. Its initial output luminance was about 1400 cd/m², and the voltage between the anode and the cathode was 8.6 V. The external efficiency of this device was about 1.2% ph/el at 8–10 V and about 0.5% ph/el at lower voltage around 2 V. The half-life of the device was also between 300 and 500 hours, and the emission spectrum had the maximum at 535 nm typical of $Alq_3$ emission.

EXAMPLE 3

Example 2 was repeated with a dibenzotetraphenylperiflanthene compound (DBTPPF, FIG. 7) co-evaporated together with the Alq$_3$ of the electron injecting and transporting layer. A sixth RADAK II™ evaporation source was used for the DBTPPF compound. The rate of the Aq$_3$ deposition was fixed at 2.5 Å/sec and the rate of the DBTPPF compound was fixed at that which gave a dopant concentration of 4% by weight. When the thickness of the doped Alq$_3$ layer reached 250 Å, evaporation of the DBTPPF was stopped and a further 370 Å of undoped Alq$_3$ was deposited.

The resulting organic EL device was operated in a N$_2$-rich dry box under the same conditions as Example 1. Its initial output luminance was about 760 cd/m$^2$ and the voltage between the anode and the cathode was 8.5 V. After 900 hours of continuous constant-current operation, the luminance of the device decayed to 420 cd/m$^2$. Most of the luminance decay occurred during the first 10–20 hours. After that time, the luminance decayed very slowly. No changes in the emission spectrum were observed during the constant-current stress test.

The light generated by this device has a red-pink appearance. Compared with Example 2, an enhancement in the device quantum efficiency of about three times was found, but the efficiency enhancement was strongly dependent upon the applied voltage. At 2.2 V, the Example 3 device had a measured external efficiency of up to 5% ph/el, but at 10 V, the efficiency was closer to 2.5% ph/el. Most of the emission was concentrated in a narrow emission band (FWHM~40 nm) centered at 610 nm. Additional light emission in the deep red, λ>700 nm, was detected, and about 10% of the photons had the typical Alq$_3$ spectrum.

EXAMPLE 4

Example 3 was repeated with the deposition rate of the DBTPPF compound fixed at a rate that gave a dopant concentration of 8 wt. %. The thickness of the doped Alq$_3$ layer was 400 Å, followed by 220 Å of undoped Alq$_3$.

The resulting organic EL device was operated in a N$_2$-rich dry box under the same conditions as Example 1. Its initial output luminance was about 52 cd/m$^2$ and the voltage between the anode and the cathode was 9.7 Volts. After 2,700 hours of continuous constant-current testing, the luminance of the device decayed to 30 cd/m$^2$. As with the Example 3 device, most of the luminance decay occurred at the first 10–20 hours. After that time, the luminance decayed very slowly. No changes in the emission spectrum were observed during the constant-current stress test.

This device was observed to emit red light in a narrow wavelength band centered at 610 nm, and additional deep red emission, λ>700 nm, was also detected. No traces of green light were detected with this high concentration of the DBTPFF compound. The external efficiency was again strongly dependent upon the electric field. At 2 V, the measured external efficiency was close to 2% ph/el, whereas at 10 V, the external efficiency was about 0.5% ph/el.

EXAMPLE 5

Example 3 was repeated with the deposition rate of the DBTPPF compound fixed at a rate that gave a dopant concentration of 2 wt. %. The entire 600 Å-thick electron injecting and transporting layer of Alq$_3$ was doped with the DBTPPF compound. The light emitted by this device had a pink appearance. A majority of the emission was centered at 610 nm, but 20–30% of the photons had the typical Alq$_3$ emission spectrum. This device exhibited a significant improvement in quantum efficiency compared to the Example 2 device. At 7 V, the measured external efficiency of the Example 5 device was 3.4% ph/el.

EXAMPLE 6

Example 3 was repeated with the deposition rate of the DBTPPF compound fixed at a rate that gave a dopant concentration of 1 wt. %. The entire 600 Å-thick electron injecting and transporting layer of Alq$_3$ was doped with the DBTPPF. The light emitted by this device has a whitish appearance, and had spectral peaks at 610 nm and at 535 nm. This device also exhibited a significant improvement in quantum efficiency compared to the Example 2 device.

While the embodiments discussed above have utilized hole and electron transport layers, embodiments in which these layers are absent can also be constructed using the class of dopants taught herein. A device such as shown in FIG. 1 without layers 13 and 15 will also generate light provided the luminescent layer 14 is constructed from a material that transports both holes and electrons. The luminescent layer can be generated by spin casting a high molecular weight polymeric compound doped with the dopants of the present invention, or by evaporating a suitable material.

Various modifications to the present invention will become apparent to those skilled in the art from the foregoing description and accompanying drawings. Accordingly, the present invention is to be limited solely by the scope of the following claims.

What is claimed is:

1. An OLED comprising:
   a cathode comprising a first conducting layer;
   an electroluminescent layer comprising a dopant and a transport material; and
   an anode comprising a second conducting layer, wherein said anode is transparent to light generated by said electroluminescent layer, wherein said dopant comprises a compound of the formula:

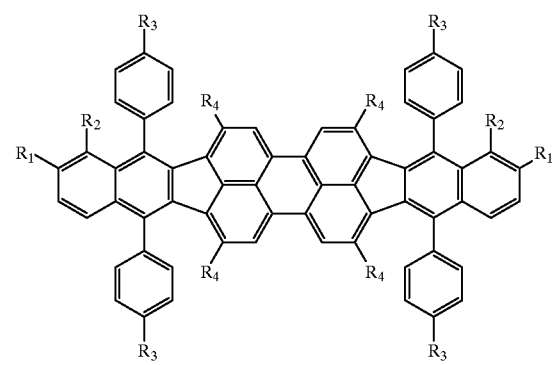

wherein R1–R4 are independently selected from the group consisting of hydrogen, alkyls and substitutions thereof, alkoxyls and substitutions thereof, aryls and substitutions thereof, and halogens.

2. The OLED of claim 1 wherein said dopant comprises dibenzotetraphenylperiflanthene.

3. The OLED of claim 1 further comprising an electron transport layer comprising a first electron transport material sandwiched between said cathode and said electroluminescent layer, said transport material comprising said first electron transport material.

4. The OLED of claim 2 further comprising a hole transport layer comprising a first hole transport material, said sandwiched between said anode and said electroluminescent layer.

5. The OLED of claim 4 further comprising a second hole transport layer comprising a second hole transport material, said second hole transport layer being sandwiched between said anode and said first hole transport layer.

6. The OLED of claim 4 further comprising a second electron transport layer comprising a second electron transport material, said second electron transport layer being sandwiched between said electroluminescent layer and said first hole transport layer.

* * * * *